United States Patent
Bolken et al.

(10) Patent No.: US 7,091,060 B2
(45) Date of Patent: Aug. 15, 2006

(54) CIRCUIT AND SUBSTRATE ENCAPSULATION METHODS

(75) Inventors: Todd O. Bolken, Meridian, ID (US); Cary J. Baerlocher, Meridian, ID (US); David J. Corisis, Meridian, ID (US); Chad A. Cobbley, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/430,102

(22) Filed: May 5, 2003

(65) Prior Publication Data

US 2003/0201526 A1 Oct. 30, 2003

Related U.S. Application Data

(62) Division of application No. 10/340,331, filed on Jan. 9, 2003, which is a continuation of application No. 09/834,415, filed on Apr. 13, 2001, now Pat. No. 6,518,654, which is a division of application No. 09/448,072, filed on Nov. 23, 1999, now Pat. No. 6,329,220.

(51) Int. Cl.
*H01L 21/44* (2006.01)
*H01L 21/48* (2006.01)
*H01L 21/50* (2006.01)

(52) U.S. Cl. ............... 438/106; 438/112; 438/124; 438/126; 438/127

(58) Field of Classification Search ................ 438/126
See application file for complete search history.

(56) References Cited

U.S. PATENT DOCUMENTS

| | | | |
|---|---|---|---|
| 4,012,768 A | 3/1977 | Kirk et al. | |
| 4,563,725 A | 1/1986 | Kirby | |
| 4,641,176 A | 2/1987 | Keryhuel et al. | |
| 5,139,972 A | 8/1992 | Neugebauer et al. | |
| 5,163,551 A | 11/1992 | Bhatia | |
| 5,216,278 A | * 6/1993 | Lin et al. ..................... | 257/688 |
| 5,220,486 A | 6/1993 | Takubo et al. | |
| 5,223,739 A | 6/1993 | Katsumata et al. | |
| 5,246,129 A | 9/1993 | Small et al. | |
| 5,293,072 A | 3/1994 | Tsuji et al. | |
| 5,362,679 A | 11/1994 | Wakefield | |
| 5,440,169 A | * 8/1995 | Tomita et al. .............. | 257/667 |
| 5,448,114 A | 9/1995 | Kondoh et al. | |
| 5,557,150 A | * 9/1996 | Variot et al. ................ | 257/787 |
| 5,583,377 A | 12/1996 | Higgins, III | |
| 5,583,378 A | 12/1996 | Marrs et al. | |
| 5,604,376 A | 2/1997 | Hamburgen et al. | |
| 5,625,222 A | 4/1997 | Yoneda et al. | |
| 5,650,593 A | 7/1997 | McMillan et al. | |
| 5,653,020 A | * 8/1997 | Romano' et al. ............. | 29/856 |
| 5,677,566 A | * 10/1997 | King et al. .................. | 257/666 |

(Continued)

FOREIGN PATENT DOCUMENTS

| | | |
|---|---|---|
| FR | 2570221 | 4/1984 |
| JP | 358122753 | 7/1983 |
| JP | 359188948 | 10/1984 |
| JP | 01298753 | 12/1989 |
| JP | 403116949 | 5/1991 |
| JP | 403147355 | 6/1991 |

*Primary Examiner*—Michael Lenbentritt
*Assistant Examiner*—Andre Stevenson
(74) *Attorney, Agent, or Firm*—Williams, Morgan & Amerson, P.C.

(57) ABSTRACT

A ball grid array assembly includes a package cover that encapsulates a die and a portion of a substrate to which the die is attached, including an edge of the substrate. Encapsulation of the substrate edge by the cover reduces penetration of moisture or other contaminants into the substrate. The cover includes a rib that extends to contact a circuit board to which the ball grid array assembly is connected. With such a rib, planarity between the circuit board and the substrate is maintained during soldering.

3 Claims, 3 Drawing Sheets

U.S. PATENT DOCUMENTS

| | | | |
|---|---|---|---|
| 5,703,398 A | 12/1997 | Sono et al. | |
| 5,708,304 A | 1/1998 | Tomita | |
| 5,710,459 A | 1/1998 | Teng et al. | |
| 5,766,972 A | 6/1998 | Takahashi et al. | |
| 5,775,510 A | 7/1998 | Hodges | |
| 5,796,162 A | 8/1998 | Huang | |
| 5,819,398 A | 10/1998 | Wakefield | |
| 5,869,889 A | 2/1999 | Chia et al. | |
| 5,893,724 A * | 4/1999 | Chakravorty et al. | 438/108 |
| 5,895,967 A | 4/1999 | Stearns et al. | |
| 5,909,056 A | 6/1999 | Mertol | |
| 5,914,531 A | 6/1999 | Tsunoda et al. | |
| 5,930,603 A | 7/1999 | Tsuji et al. | |
| 5,976,912 A * | 11/1999 | Fukutomi et al. | 438/110 |
| 5,986,340 A | 11/1999 | Mostafazadeh et al. | |
| 5,990,544 A | 11/1999 | Ohshima | |
| 5,998,241 A | 12/1999 | Niwa | |
| 5,998,862 A | 12/1999 | Yamanaka | |
| 6,002,178 A | 12/1999 | Lin | |
| 6,023,098 A | 2/2000 | Higashiguchi et al. | |
| 6,032,098 A | 2/2000 | Takahashi et al. | |
| 6,032,355 A | 3/2000 | Tseng et al. | |
| 6,032,362 A | 3/2000 | Okikawa et al. | |
| 6,038,136 A * | 3/2000 | Weber | 361/783 |
| 6,048,754 A | 4/2000 | Katayama et al. | |
| 6,049,038 A | 4/2000 | Suzuki | |
| 6,075,289 A | 6/2000 | Distefano | |
| 6,080,932 A * | 6/2000 | Smith et al. | 174/52.4 |
| 6,114,189 A * | 9/2000 | Chia et al. | 438/112 |
| 6,114,192 A * | 9/2000 | Tsunoda et al. | 438/126 |
| 6,149,010 A | 11/2000 | Tanaka et al. | |
| 6,166,434 A | 12/2000 | Desai et al. | |
| 6,166,435 A | 12/2000 | Leu et al. | |
| 6,175,497 B1 | 1/2001 | Tseng et al. | |
| 6,179,127 B1 | 1/2001 | Kato et al. | |
| 6,187,612 B1 | 2/2001 | Orcutt | |
| 6,225,144 B1 | 5/2001 | How et al. | |
| 6,249,403 B1 | 6/2001 | Tokisue et al. | |
| 6,258,630 B1 | 7/2001 | Kawahara | |
| 6,261,870 B1 | 7/2001 | Haehn et al. | |
| 6,271,058 B1 | 8/2001 | Yoshida | |
| 6,329,220 B1 * | 12/2001 | Bolken et al. | 438/106 |
| 6,331,453 B1 * | 12/2001 | Bolken et al. | 438/127 |
| 6,333,564 B1 * | 12/2001 | Katoh et al. | 257/780 |
| 6,351,030 B1 * | 2/2002 | Havens et al. | 257/690 |
| 6,362,530 B1 | 3/2002 | Lee et al. | |
| 6,395,124 B1 | 5/2002 | Oxman et al. | |
| 6,404,070 B1 | 6/2002 | Higashi et al. | |
| 6,425,484 B1 | 7/2002 | Sakurai | |
| 6,429,530 B1 | 8/2002 | Chen | |
| 6,432,742 B1 | 8/2002 | Guan et al. | |
| 6,432,749 B1 | 8/2002 | Libres | |
| 6,486,554 B1 * | 11/2002 | Johnson | 257/738 |
| 6,541,310 B1 | 4/2003 | Lo et al. | |
| 6,568,535 B1 | 5/2003 | Pylant | |
| 6,576,988 B1 | 6/2003 | Corisis | |
| 6,626,656 B1 * | 9/2003 | Thummel | 425/116 |
| 6,644,982 B1 | 11/2003 | Ondricek et al. | |
| 6,660,558 B1 * | 12/2003 | Bolken et al. | 438/106 |
| 6,825,550 B1 | 11/2004 | Akram | |
| 2001/0040288 A1 | 11/2001 | Matsushima et al. | |

* cited by examiner

CIRCUIT AND SUBSTRATE ENCAPSULATION METHODS

RELATED APPLICATIONS

This application is a divisional of application Ser. No. 10/340,331, filed Jan. 9, 2003, which is a continuation of application Ser. No. 09/834,415, filed Apr. 13, 2001 now U.S. Pat. No. 6,518,654, which is a division of application Ser. No. 09/448,072, filed Nov. 23, 1999, now U.S. Pat. No. 6,329,220, all of which are incorporated herein by reference.

TECHNICAL FIELD

The disclosure pertains to packages for semiconductor die and methods of packaging semiconductor die.

BACKGROUND

Semiconductor fabrication processes have been developed that permit the integration of very large numbers of transistors, diodes, and other circuit elements onto a single integrated circuit. Such integrated circuits generally require large numbers of electrical connections to receive inputs and supply outputs. Because these integrated circuits are generally very small, the required input/output electrical connections on the integrated circuit are both numerous and densely spaced.

A significant problem in the use of integrated circuits is packaging the integrated circuit in such a way as to electrically connect to the many, densely spaced input/output electrical connections. If the input/output electrical connections must be spread out to permit electrical connections to other integrated circuits, other circuits or circuit components such as printed circuit boards, then much of the advantage of integrated circuit miniaturization is lost.

One method of packaging integrated circuits for electrical connection to a printed circuit board is the so-called ball grid array (BGA) package. A BGA package includes a semiconductor die (an integrated circuit) that is attached to a substrate. Electrical connections are made from the die to the substrate with bond wires that are attached to bond pads provided on the die and the substrate. The bond pads on the substrate are electrically connected to an array of solder balls or bumps, and these solder balls are used to bond and make electrical connection to the printed circuit board. BGA packages are described in, for example, Tsuji et al., U.S. Pat. No. 5,930,603, Tsunoda et al., U.S. Pat. No. 5,914,531, and Tsuji et al., U.S. Pat. No. 5,293,072.

Not only are BGA packages more compact than other packages, BGA packaged devices generally have superior thermal and electrical properties. The solder balls provide an excellent thermal path for the removal of heat from the semiconductor die as well as providing low resistance, low inductance electrical connections.

BGA packages have several drawbacks. For example, soldering a BGA packaged device to a printed circuit board can require precise soldering process control. Accordingly, improved packages, packaging methods, and packaging apparatus are needed.

SUMMARY OF THE INVENTION

Packaged semiconductor die are provided that include a semiconductor die attached to a first major surface of a substrate. One or more solder bumps or balls are attached to a second major surface of the substrate opposite to the first major surface. A substrate edge extends between the first and second major surfaces. An elongated rib projects outwardly from the second major surface and extends along at least part of a perimeter portion of the second surface. In some embodiments, the rib overlaps and encapsulates at least a portion of the substrate edge. The rib may comprise a band or frame that borders the entire perimeter of the second surface of the substrate. The field or space within the frame may comprise a void or recess bounded by the frame and second surface of the substrate and which is void of material except for solder bumps within the recess.

In additional embodiments, packaged die include a package cover that encapsulates at least a perimeter portion of the first surface of the substrate and the semiconductor die. Some embodiments includes bond wires that electrically connect the semiconductor die to the substrate, and the package cover encapsulates the bond wire. In other embodiments, the packaged semiconductor die includes an adhesive layer that bonds the semiconductor die to the first surface of the substrate.

Integrated circuit assemblies are provided that include a semiconductor die that is attached and electrically connected to a substrate. Solder bumps electrically connect the substrate to a circuit board and a package cover encapsulates the semiconductor die and at least a portion of an edge of the substrate. The package cover includes a rib that extends to contact the circuit board.

Mold sets are provided for molding a package for at least one die bonded to a substrate. The mold sets include an upper mold and a lower mold. The upper mold defines a package cover for encapsulating the die and a portion of a surface of the substrate to which the die is bonded while the lower mold defines a rib that extends from a surface of the substrate. In a specific embodiment, the upper mold and lower mold define the package cover and the rib so that a portion of the substrate edge is encapsulated by either the package cover or the rib, or both the package cover and the rib. In additional embodiments, the upper mold and the lower mold define package covers and ribs for a plurality of die bonded to the substrate such as a substrate strip.

Methods of reducing moisture penetration into a circuit assembly that includes a substrate and a circuit board are provided that include covering at least a portion of an edge of a substrate with an encapsulant. In addition, a rib may be formed that covers at least a portion of a first surface of the substrate and extends from a second surface of the substrate and contacts the circuit board. In further embodiments, the circuit assembly includes a die and the die is covered with the encapsulant.

Methods of soldering a substrate provided with solder bumps to a circuit board are provided. The methods include contacting the circuit board with the solder bumps and heating the solder bumps so that the solder bumps reflow, thereby connecting the solder bumps to the circuit board. A projecting stop is situated along at least a portion of the periphery to maintain a separation between the substrate and the circuit board as the solder bumps reflow. In some embodiments, the solder bumps are heated so that the stop contacts the circuit board and the stop is bonded to the circuit board and the substrate. The stop may comprise an elongated rib which projects from the surface of the substrate containing the bumps. Typically an elongated portion of the stop is positioned along each side of the periphery of the substrate to maintain the desired spacing.

Methods of packaging a die are provided that include bonding the die to a first surface of a substrate and attaching one or more solder bumps to a second surface of the substrate. In addition, an encapsulating layer is provided that encapsulates the die, wherein the encapsulating layer includes a rib that encapsulates at least a perimeter portion of the second surface of the substrate. In some embodiments, the encapsulating layer encapsulates at least a portion of the first surface of the substrate and the rib is defined with a mold. In other embodiments, the rib has a thickness that is at least as large as a thickness of the solder bumps.

Methods of attaching a substrate to a circuit board are provided that include providing a rib that covers a perimeter portion of a surface of a substrate and electrically connecting the substrate to the circuit board so that the separation of the substrate and the circuit board is defined by the rib.

Methods of attaching a ball grid array packaged die to a circuit board are provided that include providing a support rib at a perimeter of a surface of the ball grid array packaged die and heating the packaged die to reflow solder bumps provided at the surface.

Methods of making a package for a die mounted to a substrate are provided that include contacting a first surface of the substrate with a first mold and contacting the first mold with a second mold. An encapsulant is injected into a cavity defined by the first mold and the second mold, wherein one of the first mold and the second mold define a cavity for a rib.

The invention is directed to novel and non-obvious aspects of this disclosure, both individually and in combination as set forth in the claims below.

DETAILED DESCRIPTION

Figure 1:
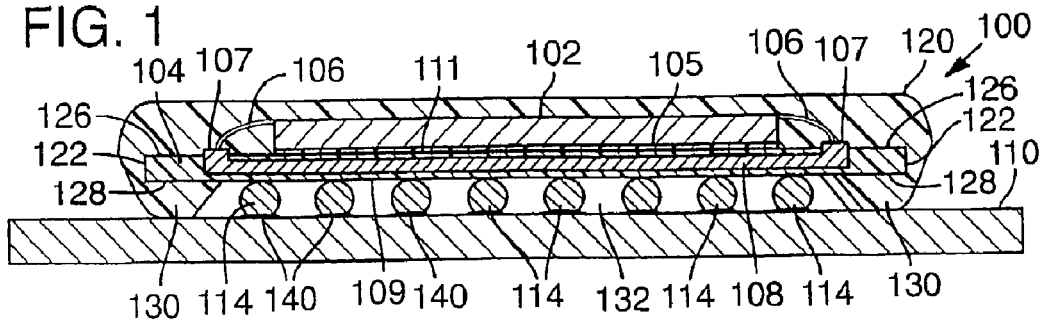
FIG. 1 is a sectional view of one form of a ball grid array (BGA) assembly that is soldered to a printed circuit board.
Figure 2:
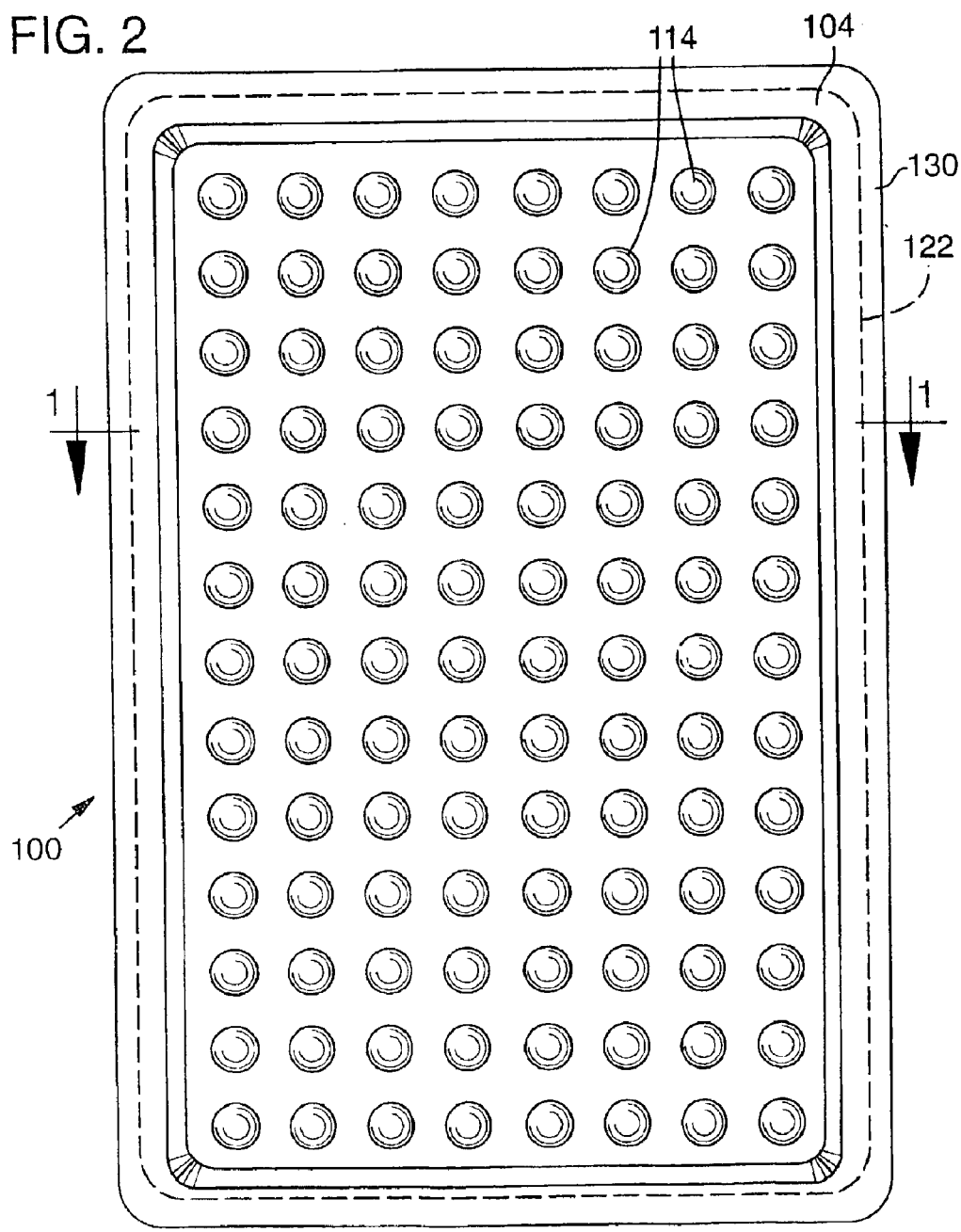
FIG. 2 is a plan view of the BGA assembly of FIG. 1, without the printed circuit board.

FIG. 1 illustrates a ball grid array (BGA) assembly 100 that is shown soldered to a printed circuit board (PCB) 110. FIG. 2 is a plan view of the BGA assembly 100, without the PCB 110. The BGA assembly 100 includes a semiconductor die 102, such as an integrated circuit, that is mounted to a substrate 104, such as by being adhesively bonded thereto with a tape adhesive 105, an epoxy, or other adhesive. One or more bond wires 106 or other interconnect electrically connect the semiconductor die 102 to bond pads 107 on the substrate 104. The substrate 104 generally defines one or more circuit patterns 108 that electrically connect the semiconductor die 102 to solder balls or bumps 114 attached to a surface 109 of the substrate 104 via the bond wires 106. The solder balls or bumps 114 are typically attached to the substrate 104 at bond pads 138. The PCB 110 is attached to the substrate 104 by the solder balls 114, completing the electrical connection of the semiconductor die 102 to the PCB 110.

The substrate 104 may be a multilayer material that includes layers of conducting and insulating materials. Representative materials include insulating circuit board base materials such as polyimide, glass epoxy, and glass fiber layers, as well as conducting layers such as copper, and solder resist layers. The illustrated substrate includes first and second major opposed surfaces 111, 109 with a substrate edge 122 extending between the major surfaces. In FIG. 1, the die 102 is mounted to the first or upper major surface 111 of the substrate and the solder balls project outwardly from the second or lower major surface 109 in a direction away from the first surface.

The semiconductor die 102 and the bond wires 106 in the illustrated embodiment are encapsulated by a package cover 120. Cover 120 may be made of a cured liquid encapsulant, a cured epoxy, a molded plastic, a cured liquid resin, or other material. The package cover 120 in the examples shown also encapsulates at least a portion of, and in this case the entire perimeter region 126 of the upper major substrate surface 111 as well as the substrate edge 122, and a perimeter region 128 of the lower major surface 111 of the substrate 104. The package cover 120 includes a rib 130 that extends from the surface 109 to the PCB 110. The rib 130 projects outwardly from surface 109 in the same direction as the solder balls 114. The rib 130 is preferably elongated and extends along at least a portion of the perimeter of the substrate. The rib may comprise a band or frame which extends along the entire periphery or perimeter of the substrate. In this case, the package cover 120, the PCB 110, and the surface 109 form a cavity 132 that encloses the solder balls 114. That is, the solder balls in this case are positioned within a field bordered by the rib 130 with the cavity 132 being void of material between at least a plurality of the balls and desirably between all of the balls.

The BGA assembly 100 can be bonded to the PCB 110 with a soldering process. The BGA assembly 100 is placed in contact with the PCB 110 so that the solder balls 114 contact bond pads 140 on the PCB 110. The BGA assembly 100 and the PCB 110 are arranged so that gravity or other force presses the BGA assembly 100 and the PCB 110 together. The BGA assembly 100 and the PCB 110 are then heated, generally in an oven or on a hot plate, so that the solder balls 114 solder to the bond pads 140.

The soldering process can be characterized by a time-temperature exposure profile that specifies temperatures and the durations for which the BGA assembly 100 and the PCB 110 are exposed to the temperatures. The time-temperature exposure profile frequently includes time intervals during which the exposure temperature increases or decreases ("ramp" times) and time intervals during which a constant temperature is maintained ("soak" times). Ramp times generally reduce thermally-induced stresses while soak times permit the BGA assembly 100 and the PCB 110 to reach selected temperatures. Soldering the BGA assembly 100 to the PCB 110 requires sufficient heating to reflow the solder balls 114 to form an electrical connection to the bond pads 140 the PCB 110. The rib 130 may have a thickness slightly greater than the diameter of the solder balls 114. When the solder balls 140 reflow, the rib 130 eventually contacts the PCB 110, and acts as a stop which fixes the separation of and maintains the planarity of the PCB 110 and the BGA assembly 100. This stop function is enhanced by positioning the rib about the entire periphery of the substrate. However, the stop function may be achieved by the placement of a section of elongated rib on two or more sides of the perimeter of this substrate or by alternative rib placements. For example, a rib can be placed on an interior portion of the surface 109, so that the rib is within the array of solder balls 114.

The rib 130 permits long ramp times, long soak times, or relaxed control of ramp and soak times because the rib 130 maintains the separation of the BGA assembly 100 and the PCB 110 even if the solder balls 114 reflow excessively. By maintaining the separation of the BGA 100 and the PCB 110, the rib 130 also maintains planarity between the substrate 104 and the PCB 110. In a conventional soldering process with a conventional BGA component, the time-temperature exposure profile must be carefully maintained or the BGA component and the PCB to which it is to be attached can contact, or lose planarity. The rib 130 overcomes these problems.

Figure 3:
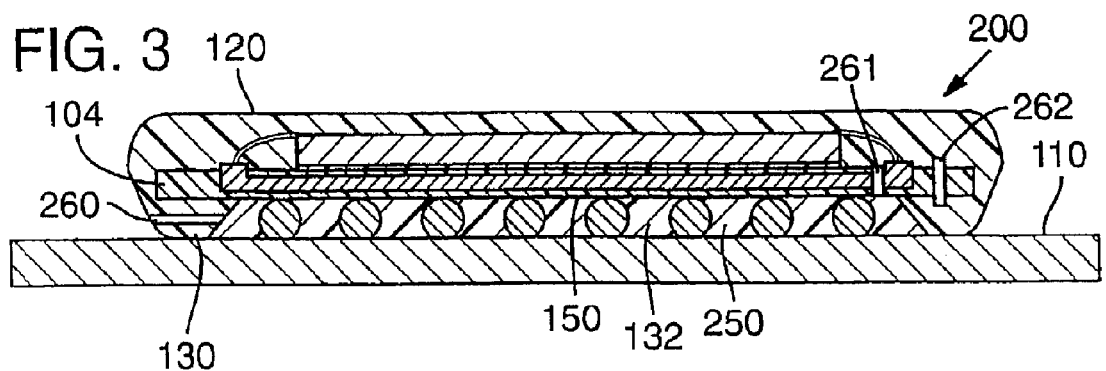
FIG. 3 is a sectional view of a BGA assembly that incorporates an encapsulating layer in the ball grid array area of the assembly.

FIG. 3 illustrates a BGA assembly 200, similar to the BGA assembly 100 of FIG. 1. The BGA assembly 200 includes an encapsulant layer 250 situated in the cavity 132 formed by the PCB 110 and the BGA assembly 200. While the BGA assembly 100 of FIG. 1 encapsulates the edge 122 and perimeter portions of the substrate 104, the encapsulant layer 250 in FIG. 3 protects a portion 150 of the surface 109 that is exposed in FIG. 1. The encapsulant layer 250 is desirably provided after the BGA assembly 200 is soldered to the PCB 110, through access holes 260 provided in the rib 130 to allow introduction of the encapsulant or through access holes 261, 262 in the substrate 104.

While the example BGA assemblies described above include solder balls, solder bumps or other solder shapes can be used. As used herein, solder bumps includes solder balls and solder in any other projecting shape, and solder refers to an electrically conducting material that reflows when heated.

The rib 130 of the FIGS. 1–2 example may extend completely around the perimeter region 128 of the substrate 104, but again, ribs that extend along only selected parts of the perimeter region 128 can be provided. For example, the rib 130 can extend along two sides of the substrate 104, or can include sections located at corners of the substrate. Alternative ribs can include one or more posts, pillars, or bumps. These posts, pillars, and bumps can be arranged individually or in an array, and positioned along the perimeter region or on an interior region of the surface 109 of the substrate 104. The ribs may be formed to overlap and encapsulate all or selected portions of the substrate edge 122.

Figure 4:
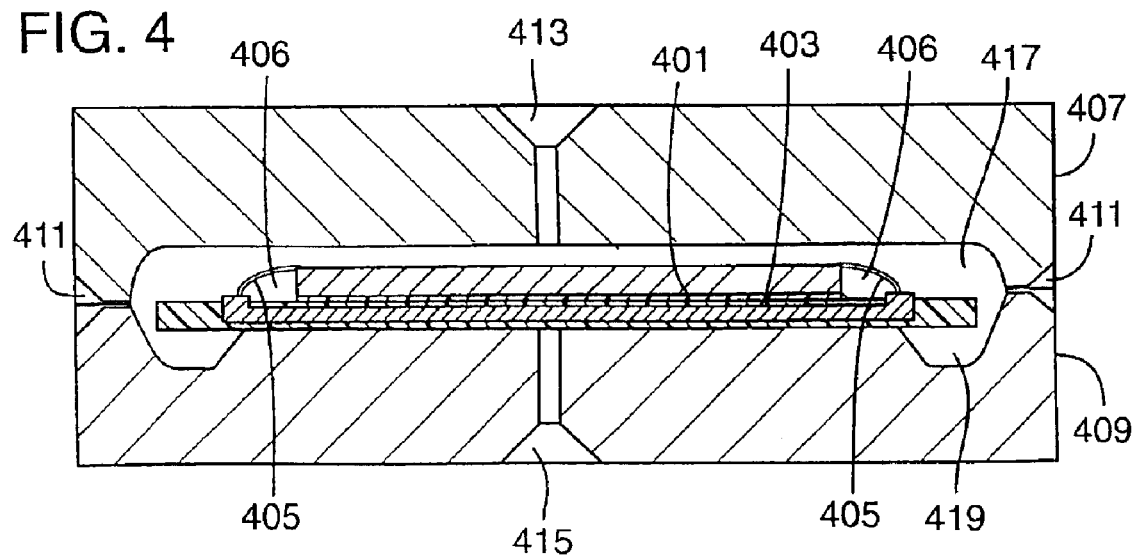
FIG. 4 illustrates molds for producing one form of a package cover and a rib for a die bonded to a substrate.

A method of forming a package, such as the package 120, using a molding process is shown in FIG. 4. A semiconductor die 401 is bonded to a substrate 403, and wire bonds 405 are provided to electrically connect the semiconductor die 401 to the substrate 403. The wire-bonded semiconductor die 401 and the substrate 403 are placed between an upper mold half 407 and a lower mold half 409. The substrate 403 can be urged toward the lower mold half 409 using a vacuum applied through a vacuum port 415. The upper mold half 407 may also feature a vacuum port 413, and additional ports 411 can be provided.

With the semiconductor die 401 and the substrate 403 positioned between the mold halves 407, 409, a resin or other encapsulating material is injected into a cavity 417 that defines a package cover and a cavity 419 that defines a rib. The cavity 419 may include an area 406 between the wire bonds 405 and the semiconductor die 401. After injecting the resin, the resin is cured. The semiconductor die 401, the substrate 403, and the molded package cover and rib may then be removed from the mold halves 407, 409. In this approach, the rib and package cover are formed as a single piece (i.e., the rib and the package cover are of a unitary one-piece integrated construction). Alternatively, the rib cavity 419 may be omitted from the lower mold half 409, and a package molded without a rib. An additional molding step and an additional mold or molds can then be used to define the rib. In the FIG. 4 approach, the solder bumps may be added to the undersurface of the substrate following molding.

Figure 5A:
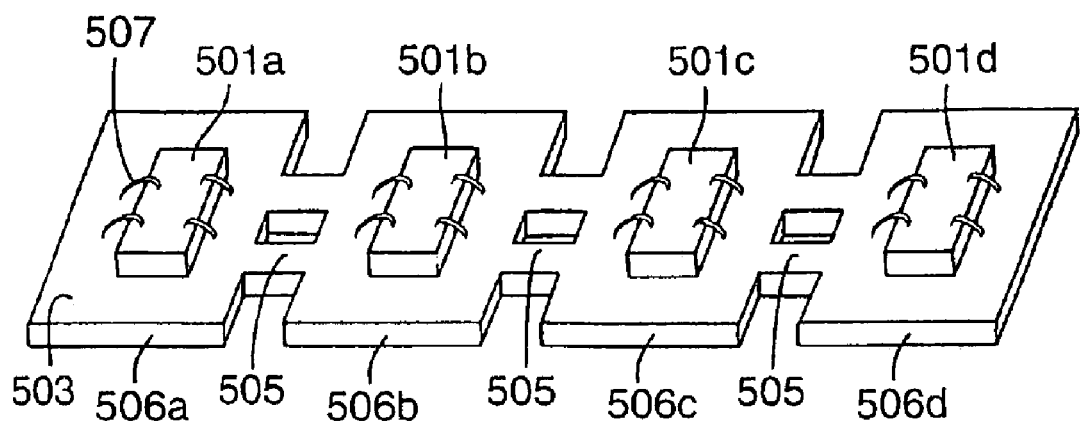
FIG. 5A is a perspective view illustrating a plurality of die bonded to a substrate strip.
Figure 5B:
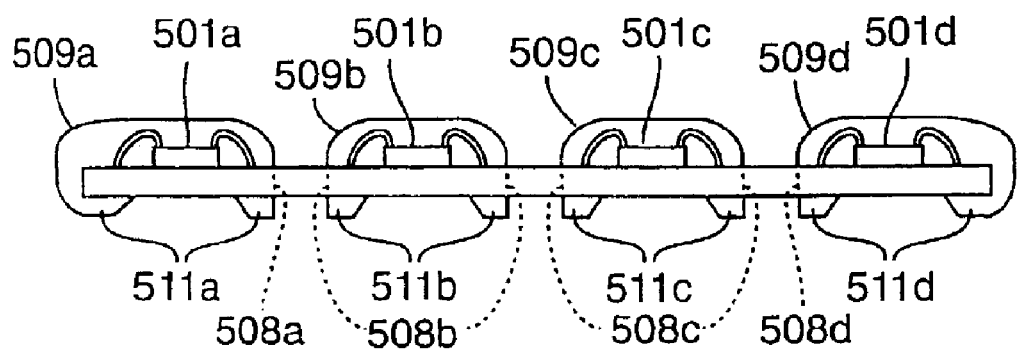
FIG. 5B is a sectional view of the substrate strip and die of FIG. 5A.
Figure 5C:
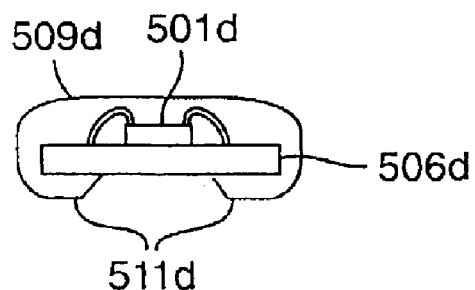
FIG. 5C is another sectional view of the substrate strip and the die of FIG. 5A.

BGA assemblies such as the BGA assemblies 100, 200 of FIGS. 1–3 may also be produced in the form of a substrate strip 503, as illustrated in FIGS. 5A–5D. Semiconductor die 501a–501d are mounted (e.g., adhesively bonded) to one major surface of the substrate strip 503 and wire bonds 507 are provided to electrically connect the semiconductor die 501a–501d to conductor patterns defined by the substrate strip 503. FIGS. 5A–5D show four semiconductor die 501a–501d attached to the substrate strip 503, but a longer or shorter substrate strip can be used to mount more or fewer semiconductor die. The substrate strip 503 includes tie bars 505 that connect substrate portions 504a–504d. After the semiconductor die 501a–501d are attached and wire bonded to the substrate strip 503, respective package covers 509a–509d and ribs 511a–511d may be formed, as by molding. The illustrated package covers 509a–509d encapsulate the semiconductor die 501a–501d, respectively. FIG. 5B is a sectional view illustrating the packages 511a–511d and FIG. 5C is a sectional view illustrating the package 511d.

Figure 5D:
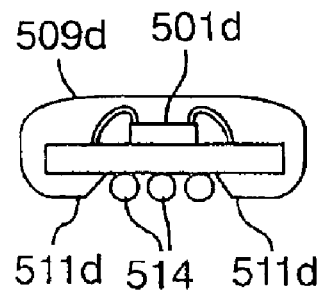
FIG. 5D is a sectional view of the substrate strip and the die of FIG. 5A with solder bumps attached.

After the package covers 509a–509d and the ribs 511a–51 Id are formed, solder bumps 514 may be formed on the substrate strip 503 as shown in FIG. 5D in a conventional manner. The substrate strip 503 is then cut, sheared, or routed at the tie bars 505 along cut lines 508a–508d so that the semiconductor die 501a–501d are attached to respective substrate portions 504a–504d and are available as individual BGA assemblies.

As illustrated in FIG. 5B, the package covers 509a–509d and ribs 511a–511d do not cover or encapsulate the entire substrate strip edges formed at respective cut lines 508a–508d after the substrate strip 503 is cut at the tie bars 505. Referring to FIG. 5C, opposed substrate edges 506d are in this example encapsulated by the package cover 509d and the rib 511d. Similarly, the package covers 509a–509c and the ribs 511a–511c encapsulate respective opposed edges 506a–506c, enhancing the protection of the substrate portions 504a–504c from penetration by moisture or other contaminants. In this illustrated embodiment even with the sheared edges of the substrate exposed, a majority of the substrate edge is encapsulated. The exposed sheared edges of the substrate may also be encapsulated, if desired.

While the invention is described with respect to particular implementations, the invention is not limited to these implementations.

We claim:

1. A method of making a package for a substrate assembly that includes a die mounted to a substrate, comprising:

contacting a first major surface of the substrate assembly with a first mold portion;

contacting the first mold with a second mold portion;

injecting an encapsulant into a cavity defined by the first mold portion and the second mold portion to cover the first major surface of the substrate assembly, an edge of the substrate assembly, and a portion of a second major surface of the substrate assembly so that the encansulant extends continuously from the first major surface to the edge, and from the edge to the second major surface, wherein the cavity is configured to form a rib on the second major surface;

providing solder balls to at least a portion of the second major surface so as to electrically connect to the die; and selecting a thickness of the rib based on a solder ball dimension.

2. A method of making a package for a substrate assembly that includes a die mounted to a substrate, comprising:

contacting a first major surface of the substrate assembly with a first mold portion;

contacting the first mold with a second mold portion; and injecting an encapsulant into a cavity defined by the first mold portion and the second mold portion to cover the first major surface of the substrate assembly, an edge of the substrate assembly, and a portion of a second major surface of the substrate assembly so that the encapsulant extends continuously from the first major surface to the edge, and from the edge to the second major surface, wherein the cavity is configured to form a rib on the second major surface; and selecting a thickness of the rib based on a solder ball dimension.

3. The method of claim 2, further comprising providing solder balls to at least a portion of the second major surface so as to electrically connect to the die.

* * * * *

UNITED STATES PATENT AND TRADEMARK OFFICE
CERTIFICATE OF CORRECTION

| | | |
|---|---|---|
| PATENT NO. | : 7,091,060 B2 | Page 1 of 1 |
| APPLICATION NO. | : 10/430102 | |
| DATED | : August 15, 2006 | |
| INVENTOR(S) | : Todd O. Bolken et al. | |

It is certified that error appears in the above-identified patent and that said Letters Patent is hereby corrected as shown below:

Col. 6, lines 60-61 (Claim 1, lines 10-11), change "encansu-lant" to -- encapsu-lant --.

Signed and Sealed this

Twenty-sixth Day of September, 2006

JON W. DUDAS
*Director of the United States Patent and Trademark Office*